United States Patent
Lin et al.

(10) Patent No.: US 10,600,769 B2
(45) Date of Patent: Mar. 24, 2020

(54) ELECTRONIC COMPONENT

(71) Applicant: Airoha Technology Corp., Hsinchu (TW)

(72) Inventors: Heng-Chih Lin, Hsinchu (TW); Chien-Kuang Lee, Zhubei (TW)

(73) Assignee: AIROHA TECHNOLOGY GROUP, Hsinchu (TW)

(*) Notice: Subject to any disclaimer, the term of this patent is extended or adjusted under 35 U.S.C. 154(b) by 0 days.

(21) Appl. No.: 15/949,212

(22) Filed: Apr. 10, 2018

(65) Prior Publication Data
US 2019/0074269 A1 Mar. 7, 2019

Related U.S. Application Data

(60) Provisional application No. 62/553,156, filed on Sep. 1, 2017.

(51) Int. Cl.
| | |
|---|---|
| *H01L 23/00* | (2006.01) |
| *H01L 25/18* | (2006.01) |
| *H01L 25/065* | (2006.01) |
| *H01L 23/498* | (2006.01) |

(52) U.S. Cl.
CPC ............ *H01L 25/18* (2013.01); *H01L 24/16* (2013.01); *H01L 24/48* (2013.01); *H01L 24/73* (2013.01); *H01L 25/0657* (2013.01); *H01L 23/49827* (2013.01); *H01L 2224/16145* (2013.01); *H01L 2224/32225* (2013.01); *H01L 2224/48227* (2013.01); *H01L 2224/73207* (2013.01); *H01L 2224/73253* (2013.01); *H01L 2224/73265* (2013.01); *H01L 2225/0651* (2013.01); *H01L 2225/06513* (2013.01); *H01L 2225/06568* (2013.01); *H01L 2924/00014* (2013.01); *H01L 2924/1032* (2013.01); *H01L 2924/1033* (2013.01); *H01L 2924/10253* (2013.01); *H01L 2924/10329* (2013.01); *H01L 2924/1424* (2013.01); *H01L 2924/1426* (2013.01); *H01L 2924/15313* (2013.01)

(58) Field of Classification Search
CPC .......... H01L 29/7786; H01L 21/02389; H01L 21/02458; H01L 21/0254; H01L 29/205
See application file for complete search history.

(56) References Cited

U.S. PATENT DOCUMENTS

| | | | |
|---|---|---|---|
| 9,589,913 B1 | 3/2017 | Shepard et al. | |
| 9,978,731 B1 * | 5/2018 | Kim | .................. H01L 23/3677 |
| 2006/0081967 A1 * | 4/2006 | Ha | ...................... H01L 23/3107 |
| | | | 257/676 |
| 2015/0200189 A1 * | 7/2015 | Teeter et al. | ............ H01L 25/00 |
| | | | 257/777 |

OTHER PUBLICATIONS

Samta Bansal: "BLOG: A Modest Proposal for Smart Weapons"; Sep. 14, 2011; pp. 1-4; https://www.eetimes.com/document.asp?doc_id=1279081.

* cited by examiner

*Primary Examiner* — Elias Ullah
(74) *Attorney, Agent, or Firm* — McClure, Qualey & Rodack, LLP

(57) ABSTRACT

An electronic component is provided. The electronic component includes a substrate, an III-V die and a silicon die. The III-V die is disposed on the substrate. The silicon die is stacked to the III-V and electrically connected to the III-V die.

12 Claims, 2 Drawing Sheets

ELECTRONIC COMPONENT

This application claims the benefit of U.S. provisional application Ser. No. 62/553,156, filed Sep. 1, 2017, the subject matter of which is incorporated herein by reference.

TECHNICAL FIELD

The disclosure relates in general to an electronic component, and more particularly to an electronic component including an III-V die.

BACKGROUND

The generally known electronic component includes a substrate and a number of dies, wherein the dies are disposed on the substrate in parallel. However, the dies are electrically connected to the substrate via a large number of bonding wires, and thus the size of the electronic component inevitably become larger.

Therefore, how to reduce the size of the electronic component has become a prominent task for any person ordinarily skilled in the technology field of the invention.

SUMMARY

According to one embodiment, an electronic component is provided. The electronic component includes a substrate, an III-V die and a silicon die. The III-V die is disposed on the substrate. The silicon die is stacked to the III-V and electrically connected to the III-V die.

The above and other aspects of the invention will become better understood with regard to the following detailed description of the preferred but non-limiting embodiment (s). The following description is made with reference to the accompanying drawings.

DETAILED DESCRIPTION

Figure 1:
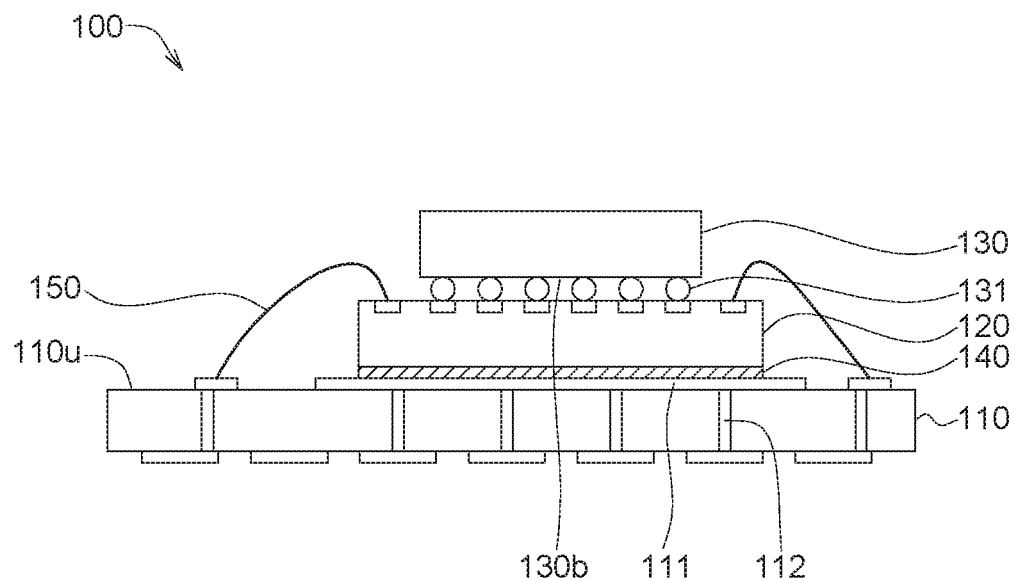
FIG. 1 shows a diagram of an electronic component according to an embodiment.

FIG. 1 shows a diagram of an electronic component 100 according to an embodiment. The electronic component 100 may be, for example, a power amplifier (PA) device, a FEM (Front End Module), etc.

The electronic component 100 at least includes a substrate 110, an III-V die 120, a silicon die 130, an adhesive layer 140 and at least one bonding wire 150.

The III-V die 120 is stacked to the substrate 110. The III-V die 120 is, for example, a power amplifier (PA), made of III-V compound semiconductor composed of the element from column III and the element from column V of the periodic table of the elements. In an embodiment, the III-V die 120 can be made of compound semiconductor composed of GaAs, GaN, HEMT, BiHEMT, etc., for example.

Due to the property of III-V compound semiconductor, the III-V die 120 can operate at a high frequency (for example, radio frequency (RF)) and provide large power.

The substrate 110 includes a metal layer 111 disposed on an upper surface 110u of the substrate 110. The III-V die 120 is disposed on the metal layer 111 through the adhesive layer 140, such that the heat generated by the III-V die 120 can be dissipated through the metal layer 111. In addition, the metal layer 111 can serve as grounding pad. The adhesive layer 140 is a die attach epoxy, or a die attach film (DAF). The adhesive layer 140 has electric conductivity and heat conductivity.

The substrate 110 further includes at least one via 112 connecting with the metal layer 111, such that the heat generated by the III-V die 120 can be dissipated outside the electronic component 100 through the metal layer 111 and the via 112.

The silicon die 130 is stacked to the III-V die 120 by flip chip technology. There are conductive contacts 131 as interconnection between the silicon die 130 and the III-V die 120. In the present embodiment, the silicon die 130 may be coupled to the III-V die 120 in a "face-down" orientation and electrically connected to the III-V die 120 via a plurality of conductive contacts 131. This configuration is referred to as "flip-chip". In addition, the silicon die 130 may be made by, for example, a CMOS (Complementary Metal-Oxide-Semiconductor) process, a SOI (Silicon on Insulator) process, a SiGe (Silicon Germanium) process, etc. In addition, the conductive contacts 131 may be, for example, solder balls, conductive pillars, conductive bumps, etc.

The III-V die 120 may be electrically connected to the substrate 110 through the bonding wire 150. Since the silicon die 130 is flip-chip to the III-V die 120, the interconnection between the silicon die 130 and the III-V die 120 can be directly coupled each other by the conductive contacts. This configuration eliminates the use of inter-connect bonding wire between the silicon die 130 and the III-V die 120, and also reduces the size of the electronic component 100 due to there is no extra bonding space required for the inter-connection between the silicon die 130 and the III-V die 120. This configuration also can minimize the interconnection inductance between the silicon die 130 and the III-V die 120.

Figure 2:
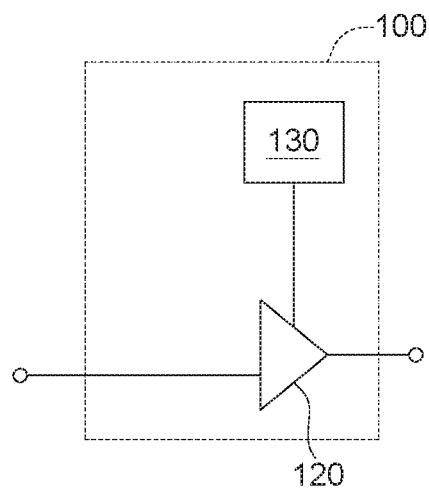
FIG. 2 shows a circuit diagram of the electronic component of FIG. 1.

FIG. 2 shows a circuit diagram of the electronic component 100 of FIG. 1. The silicon die 130 may be a controller for controlling the III-V die 120. The performance of the III-V die 120 may be optimized by the circuits on the silicon die 130.

Figure 3:
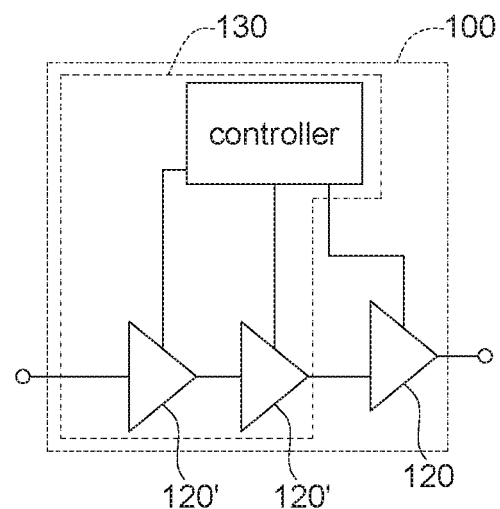
FIG. 3 shows another circuit diagram of the electronic component of FIG. 1.

FIG. 3 shows another circuit diagram of the electronic component 100 of FIG. 1. The driver stage PAs 120' may be integrated with the controller into the silicon die 130, and the performance of the III-V die 120 (for example, power stage) may be optimized by flexible configuration of the silicon die 130 including the driver stage PAs 120'.

Figure 4:
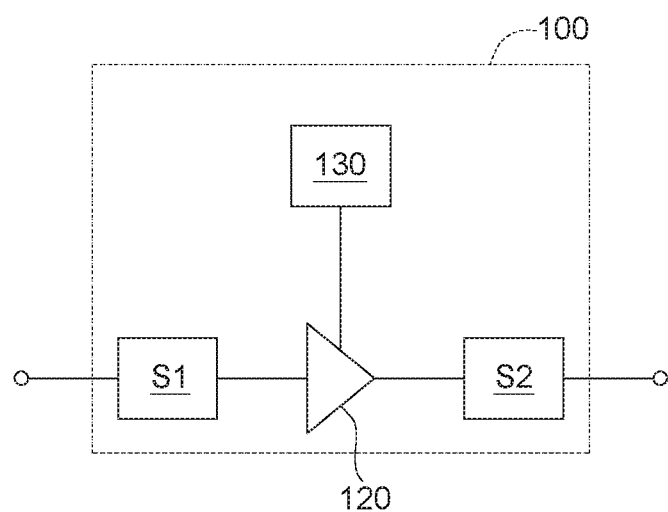
FIG. 4 shows other circuit diagram of the electronic component of FIG. 1.

FIG. 4 shows other circuit diagram of the electronic component 100 of FIG. 1. The electronic component 100 may further include switches (or switch dies) electrically coupled to the III-V die 120. In another embodiment, the silicon die 130 (for example, the controller die), the switch S1 and the switch S2 can be stacked to the III-V die 120 by flip chip technology separately. In other embodiment, the silicon die 130, the switch S1 and the switch S2 can also be integrated into a single die (for example, a controller and switch integrated die), wherein the single die may be stacked to III-V die 120 by flip chip technology.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An electronic component, comprising:
a substrate comprising a metal layer and at least one via connecting with the metal layer;
an III-V die disposed on the metal layer; and
a silicon die stacked to the III-V die, the silicon die comprises a plurality of conductive contacts on an active surface of the silicon die, and the silicon die is coupled to the III-V die in a face-down orientation and electrically connected to the III-V die via the conductive contacts,
wherein the active surface of the silicon die faces toward the substrate.

2. The electronic component according to claim 1, further comprising:
a plurality of bonding wires connecting the III-V die to the substrate.

3. The electronic component according to claim 1, further comprising:
an adhesive layer disposed between the III-V die and the metal layer.

4. The electronic component according to claim 3, wherein the III-V die is disposed on the metal layer through the adhesive layer.

5. The electronic component according to claim 1, wherein the electronic component is a power amplifier (PA) device or a Front End Module (FEM).

6. The electronic component according to claim 1, wherein the silicon die is made by a Complementary Metal-Oxide-Semiconductor (CMOS) process, a Silicon On Insulator (SOI) process or a Silicon Germanium (SiGe) process.

7. The electronic component according to claim 1, wherein the III-V die is a power amplifier.

8. The electronic component according to claim 1, wherein the silicon die is a controller for controlling the III-V die.

9. The electronic component according to claim 1, wherein the silicon die comprises a controller and an amplifier driver stage, and the III-V die is an amplifier power stage.

10. The electronic component according to claim 1, further comprises:
a switch electrically connected to the III-V die.

11. The electronic component according to claim 10, wherein the switch is stacked to the III-V die.

12. The electronic component according to claim 1, wherein the silicon die is a controller and switch integrated die and stacked to the III-V die.

* * * * *